(12) United States Patent
Menser, Jr. et al.

(10) Patent No.: US 8,113,123 B2
(45) Date of Patent: *Feb. 14, 2012

(54) OVERHEAD TRANSPORT SERVICE VEHICLE AND METHOD

(75) Inventors: Clayton D. Menser, Jr., Hopewell Junction, NY (US); David J. Pinckney, Hopewell Junction, NY (US); Uldis A. Ziemins, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/706,676

(22) Filed: Feb. 16, 2010

(65) Prior Publication Data

US 2010/0139520 A1    Jun. 10, 2010

Related U.S. Application Data

(63) Continuation of application No. 11/828,657, filed on Jul. 26, 2007, now Pat. No. 7,854,202.

(51) Int. Cl.
*B61B 3/00* (2006.01)

(52) U.S. Cl. .......................... 104/127; 104/128; 104/89

(58) Field of Classification Search ................. 104/122, 104/127, 128, 129
See application file for complete search history.

(56) References Cited

U.S. PATENT DOCUMENTS

| | | | |
|---|---|---|---|
| 1,340,962 A | 5/1920 | Lane | |
| 3,702,124 A | 11/1972 | Highland | |
| 4,122,777 A | 10/1978 | Dietrich | |
| 4,163,480 A | 8/1979 | Highland | |
| 5,048,640 A | 9/1991 | McConville et al. | |
| 5,499,694 A | 3/1996 | Dorn | |
| 6,092,678 A | 7/2000 | Kawano et al. | |
| 6,666,342 B1 | 12/2003 | House | |
| 6,695,120 B1 | 2/2004 | Trammell | |
| 6,810,817 B1* | 11/2004 | James | 104/88.04 |
| 6,848,882 B2 | 2/2005 | Tseng et al. | |
| 7,461,598 B2 | 12/2008 | Shiwaku | |

* cited by examiner

*Primary Examiner* — Joe Morano, IV
*Assistant Examiner* — Zachary Kuhfuss
(74) *Attorney, Agent, or Firm* — Ian D. MacKinnon; Roberts Mlotkowski Safran & Cole, P.C.

(57) ABSTRACT

A overhead transport service vehicle system includes a carriage frame structured and arranged to carry a user. A hoisting mechanism utilizes at least one lifting device for lifting and lowering the carriage frame and at least one moving device for causing movement of the hoisting mechanism along one of a track or rail. A control controls at least one of the at least one lifting device and the at least one moving device.

23 Claims, 10 Drawing Sheets

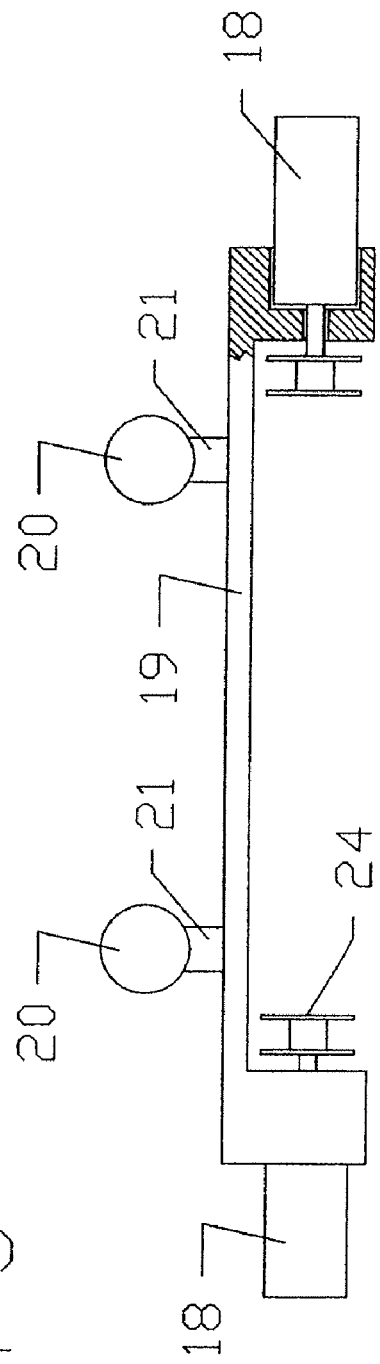
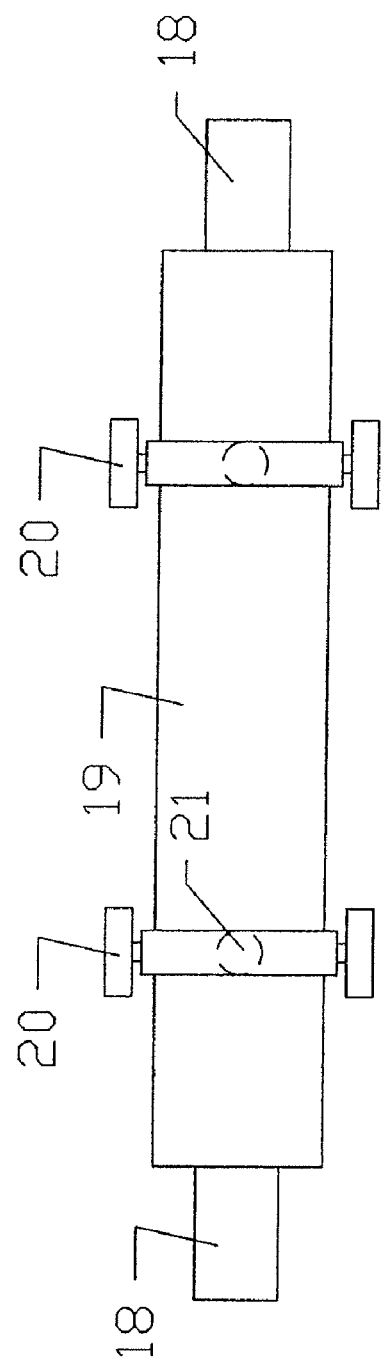
FIG. 5
FIG. 6

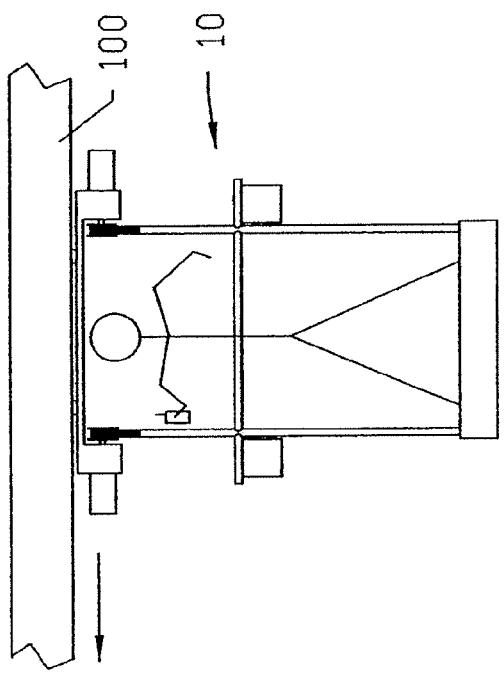
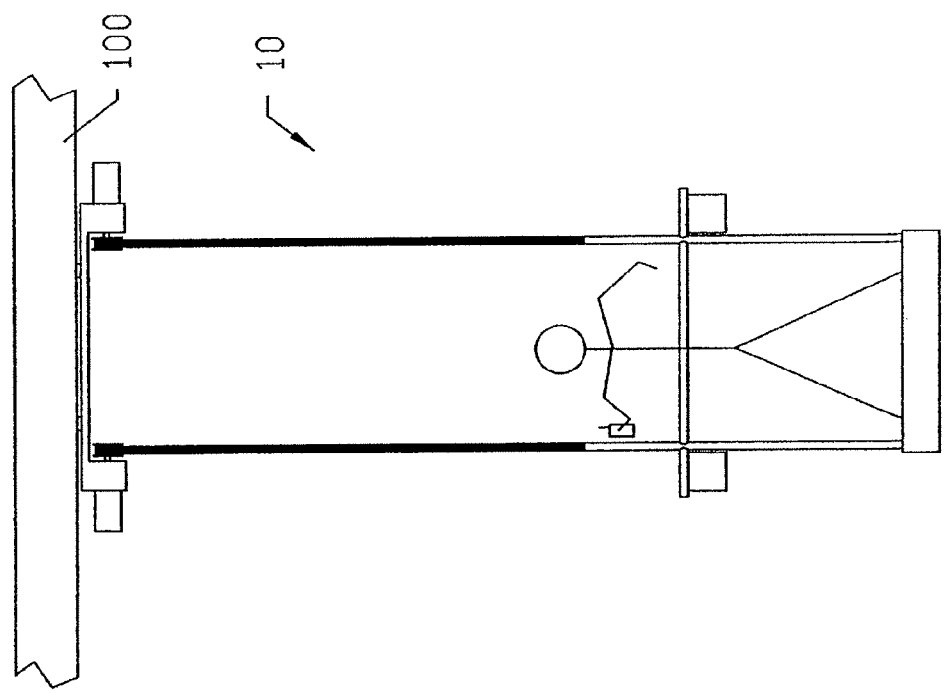
FIG. 7
FIG. 8

OVERHEAD TRANSPORT SERVICE VEHICLE AND METHOD

CROSS REFERENCE TO RELATED APPLICATIONS

The present application is a continuation application of U.S. application Ser. No. 11/828,657, filed on Jul. 26, 2007, the contents of which are incorporated by reference in their entirety herein.

FIELD OF THE INVENTION

The invention generally relates to an overhead transport service vehicle which can be used in a semiconductor manufacturing environment or facility and to a method of servicing a track or rail system using the overhead transport service vehicle.

BACKGROUND OF THE INVENTION

An automation track system of a semiconductor manufacturing facility is very difficult to access to complete preventive maintenance and repairs. This raises several concerns such as, e.g., longer downtimes for work, increased safety risks, and less reliable repairs or increased rework.

In order to maintain a high level of through-put in the semiconductor manufacturing bays, for example, the automation system in the bay needs to minimize any down time. A potentially large source of downtime for the automation system in the bay stems from repairs to track sensors and the preventive maintenance required to be performed on the track. The current solution to maintaining the track and replacing sensors is to use ladders to access the track. This can be time consuming since it requires the ladders to be continually moved as one moves down the track and raises safety concerns. This method of maintenance also leads to excessive down time for the bay.

Accordingly, there exists a need in the art to overcome the deficiencies and limitations described herein.

SUMMARY OF THE INVENTION

In a first aspect of the invention, an overhead transport service vehicle system includes a carriage frame structured and arranged to carry a user. A hoisting mechanism includes at least one lifting device for lifting and lowering the carriage frame and at least one moving device for causing movement of the hoisting mechanism along one of a track or rail. A control operates at least one of the at least one lifting device and the at least one moving device.

In a second aspect of the invention, an overhead transport service vehicle includes a carriage frame structured and arranged to carry a user. A hoisting mechanism includes at least one lifting device for lifting and lowering the carriage frame and at least one trolley assembly for moving the hoisting mechanism along one of a track or rail. A control operates the at least one lifting device and the at least one trolley assembly, the control being accessible to the user inside the carriage frame.

In a third aspect of the invention, a method of allowing a user to access an overhead track is provided. The method includes supporting the user in a carriage frame structured and arranged to carry a user, lifting the carriage frame and the user with a hoisting mechanism comprising at least one lifting device for lifting and lowering the carriage frame, and transporting the carriage frame and the user with at least one moving device for causing movement of the hoisting mechanism along the track.

BRIEF DESCRIPTION OF THE DRAWINGS

FIG. 5 shows a front view of a trolley assembly used with the embodiment of FIG. 1 in accordance with the invention;

FIG. 6 shows a top view of FIG. 5 in accordance with the invention;

FIG. 7 shows a front view of the overhead transport service vehicle of FIG. 1 installed on an overhead track and with a user positioned within a carriage of the vehicle in accordance with the invention;

FIG. 8 shows another front view of FIG. 7 after the overhead transport service vehicle is moved to a fully lifted position in accordance with the invention;

DETAILED DESCRIPTION OF EMBODIMENTS OF THE INVENTION

Figure 1:
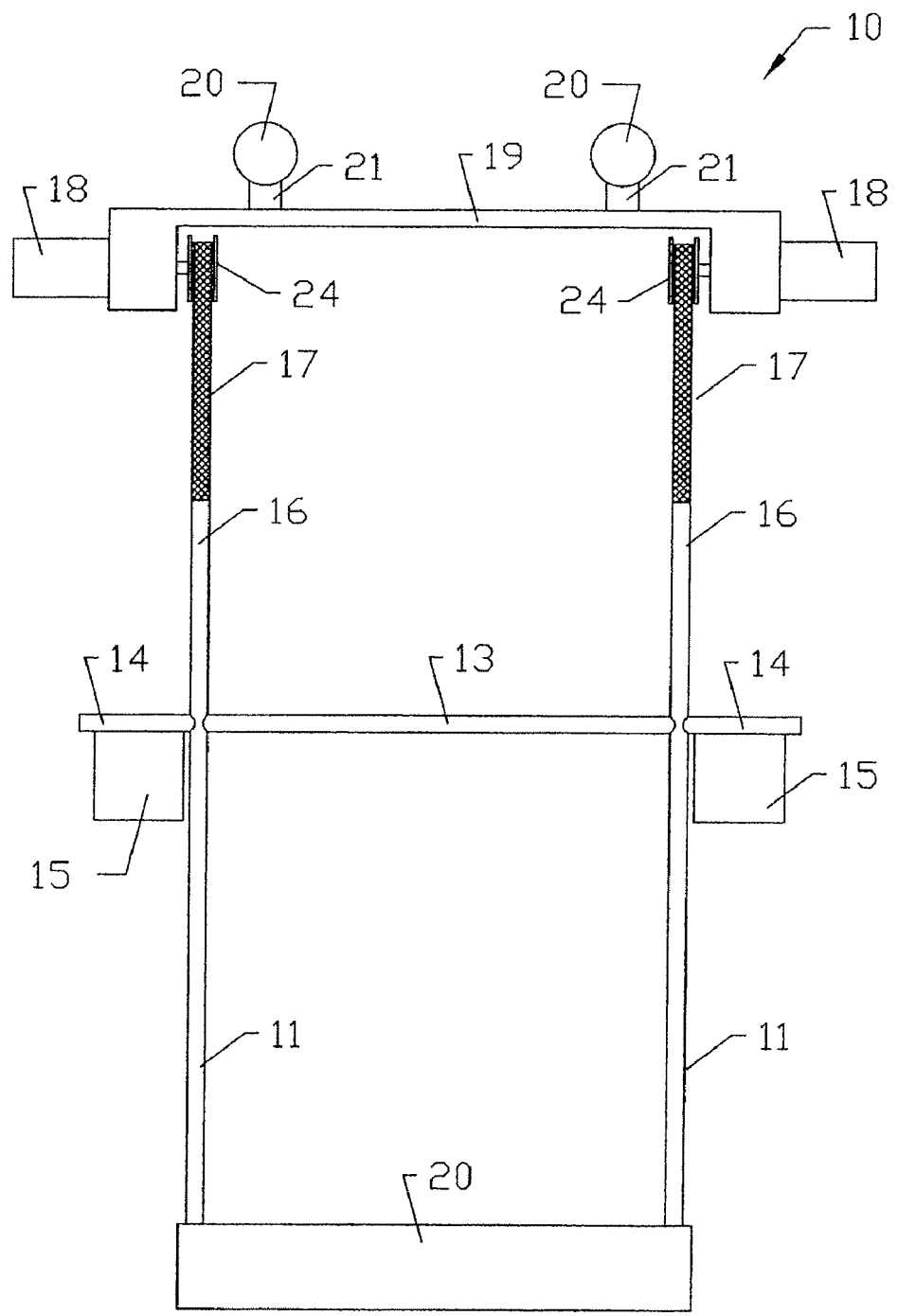
FIG. 1 shows a front view of a first embodiment of an overhead transport service vehicle in accordance with the invention.
Figure 2:
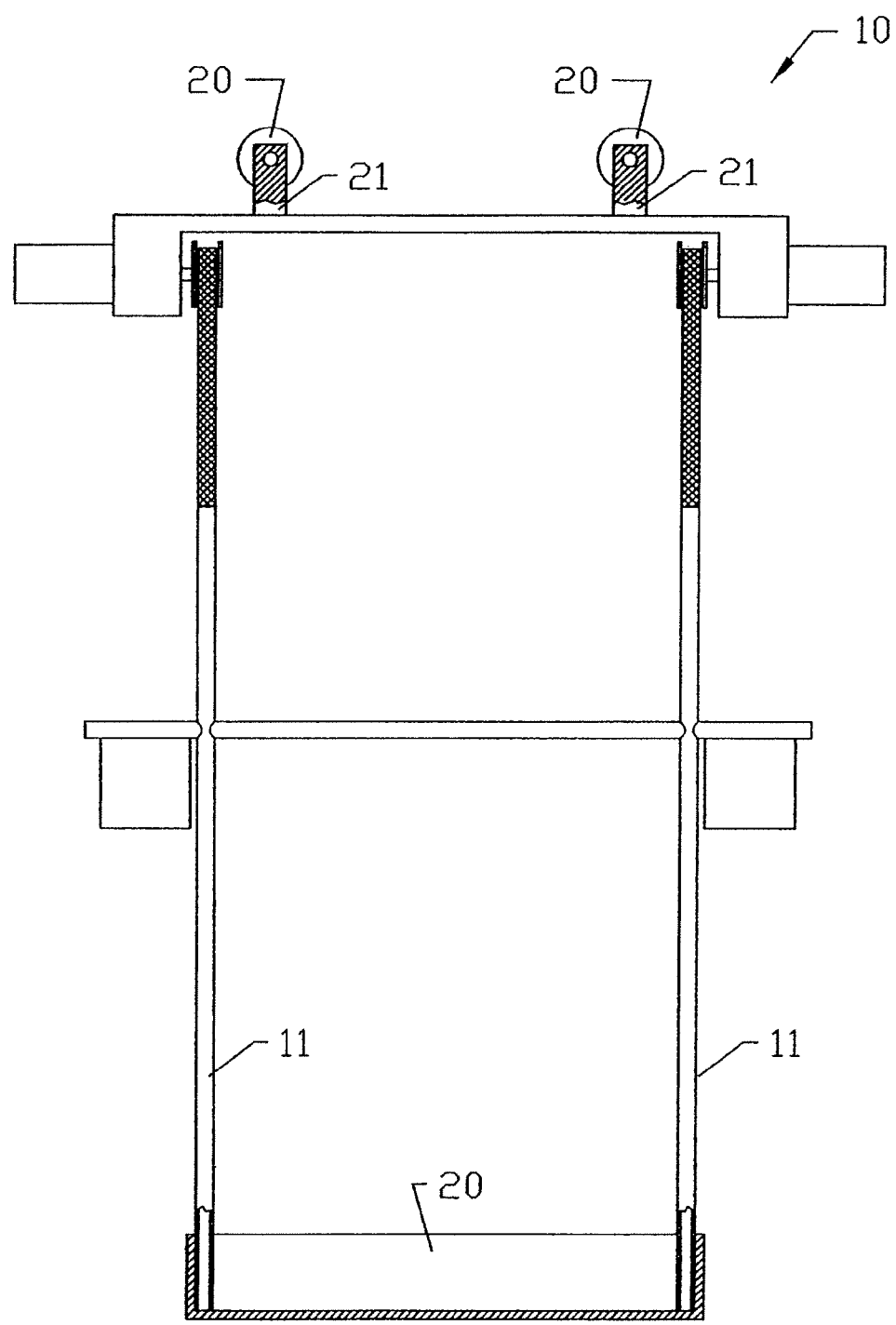
FIG. 2 shows another view of FIG. 1 certain portions thereof shown in cross-section in accordance with the invention.

The invention generally relates to an overhead transport service vehicle (OTSV) which can be used in a semiconductor manufacturing environment or facility. The invention also relates to a method of servicing a track or rail system using the overhead transport service vehicle. The servicing can involve repairing/replacing track sensors and/or performing preventative maintenance to the track.

The invention also relates to an OTSV that is able to travel along an existing track system and carry a service technician as well as tools and required component parts in order to complete preventive maintenance and sensor replacements on the track. The invention thus addresses the time consuming problem of continually moving ladders along the length of the track and also removes any safety concerns associated with extending, stretching and reaching by the user while standing on the ladder. Preferably, the OTSV has a control system on the personnel transport cart or carriage frame to allow the technician to control the operation of the OTSV from within the OTSV. This will allow the technician to travel along the rail (i.e., forward, backward, up and down) without any assistance being required from a remote operating system.

The OTSV is also preferably capable of traveling along an existing track system in the bays of a semiconductor manufacturing facility while the track system is still in its normal operating mode for production. The movement can preferably occur by way of one or more motors. The user or service technician can operate the OTSV using mechanical actuation. The invention also contemplates using an automation bay vehicle system as a means of moving the OTSV. Additionally, the OTSV can be operated by an operator assisted from the floor level. The service technician can preferably initially access the OTSV in multiple ways. One way involves the user causing the OTSV to be lowered to the floor via a hoisting mechanism using, e.g., a remote control or a fixed control arranged at floor level. Alternatively, the user can initially access the OTSV from a ladder or scaffolding.

Once the user is inside the OTSV, the user or service technician is in a safe enclosed area which allows him/her to safely and easily work on the track. The service technician also has easy access to one or more tool/part storage containers/areas in the OTSV which can adequately accommodate multiple sets of tools and/or parts. The service technician also has access to an operator interface on the OTSV to control motion of the OTSV. To maintain safe operation, the system can be configured so that the drive motor(s) will not be energized unless the service technician continuously depresses the motor controls.

Preferably, the service technician is able to use the OTSV to travel the length of an automation track system in order to facilitate a more efficient inspection of the track and complete any required preventive maintenance.

The vehicle motion will also allow the service technician to be positioned close to the track sensors and allow ease of sensor replacement in a safe manner. The vehicle operator interface or control can preferably be located on the OTSV in order to eliminate the need for another person to control the vehicle.

The OTSV can particularly be used on unified automation track systems, i.e., track systems that support an entire FAB in one continuous track. In this case, the OTSV can be left on the track in a desired service vehicle park location. In the case of automation track systems that are not unified and have individual intra-bay tracks, the OTSV can be removed from the individual bay track using existing vehicle insertion/extraction points and inserted into any bay as needed. Also, using an OTSV should result in less downtime for the individual bays in performing preventive maintenance and track repairs and also provide for a safer method of completing the work.

Figure 3:
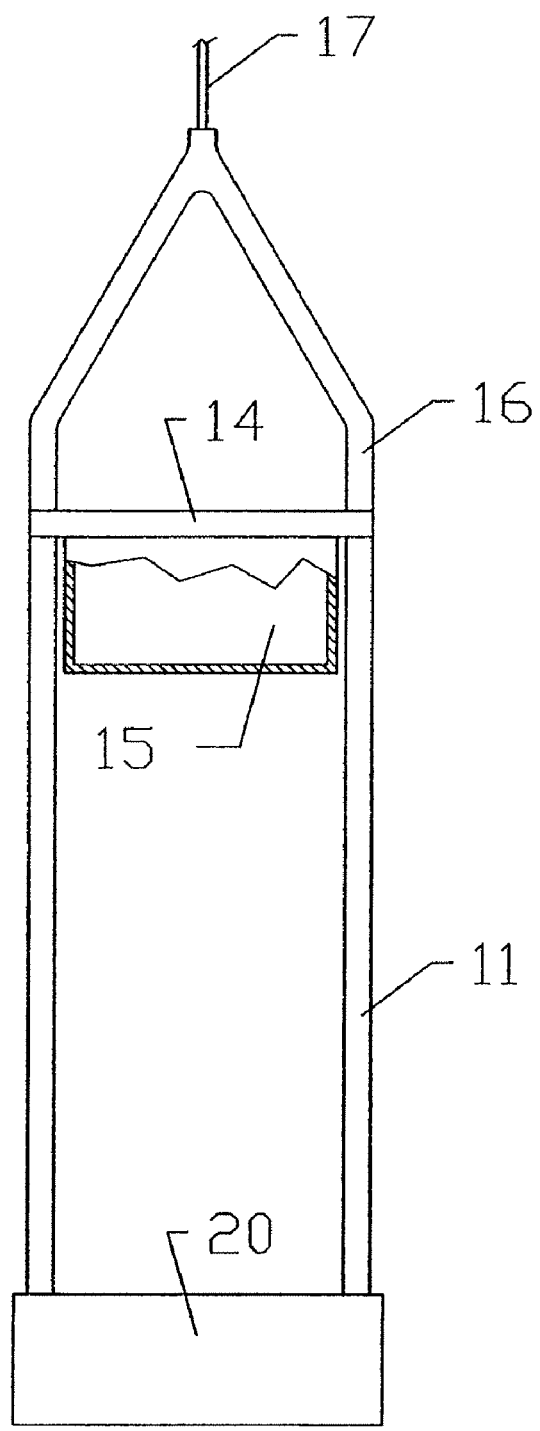
FIG. 3 shows a right-side view of the overhead transport service vehicle of FIG. 1 in accordance with the invention.
Figure 4:
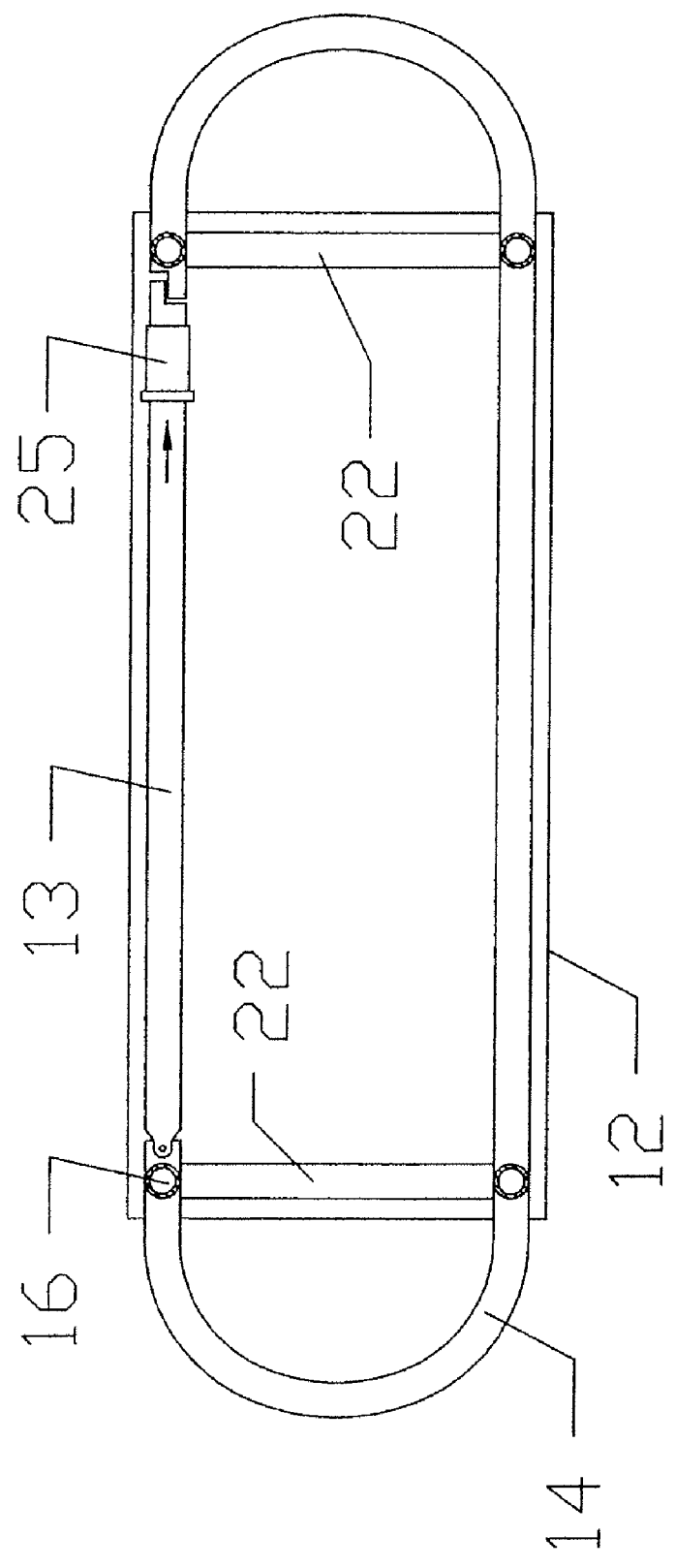
FIG. 4 shows a top view the overhead transport service vehicle of FIG. 1 with an upper portion removed in accordance with the invention.

With reference to FIGS. 1-8, there is shown one non-limiting embodiment of an overhead transport service vehicle system 10 that includes a carriage frame structured and arranged to carry a user. The carriage frame is made up of four vertical tubular members 11 whose bottom ends are connected, via e.g., fasteners or welding, to a toe kick plate member 12 (FIG. 4). The members 11 can have upper ends 16 which are bent and/or angled towards each other (FIG. 3). Two horizontal members 13 are arranged to connect each oppositely arranged pair of members 11 (FIGS. 1 and 4).

With specific reference to FIGS. 1-4, the carriage frame also includes two oppositely arranged support members 14 which are each sized and configured to support a container 15. The container 15 is preferably sized and configured to store tools and replacement parts which will be used by the user to repair a track. The container 15 is preferably removable so that a user can store the tools and parts away from the carriage frame when they are not needed. Two additional horizontal support members 22 (FIG. 4) ensure that the pairs of members 11 are spaced apart from one another and provide sufficient space of a user to comfortable stand in the carriage frame. Preferably, the members 11, 13, 14, 16 and 22 are tubular members which are welded together in order to form a lightweight carriage frame.

Again with reference to FIGS. 1-4, the system also utilizes two tension members 17. The tension members 17 can have the form of flexible straps. Each tension member 17 has one end secured to the upper end of one pair of members 16 and another end which is secured to a pulley 24 (FIG. 1). Each pulley 24 is coupled to a motor 18 and each motor 18 is mounted to a movable trolley support 19.

With reference to FIG. 4, one or both of the horizontal frame members 13 can have the form of a swing arm. The swing arm 13 can have one end pivotally mounted to a portion of the carriage frame and another end which can be locked to another portion of the carriage frame. The swing arm 13 allows the user to easily enter into and exit out of the carriage frame. The locking of the swing arm 13 can take place using any type of lock and is preferably a sliding sleeve 25 (FIG. 4) which slides over an area where the swing arm 13 meets a portion of the carriage frame. Although not shown, a spring can be used to bias the lock sleeve towards the locked position (see arrow) to prevent the swing arm 13 from swing out accidentally or inadvertently when the user is inside the carriage frame.

The invention also contemplates coupling mechanically and/or electrically the operation of the swing arm to the operation of the hoist system and/or the motors thereof. Such a system can be a system for preventing activation of the hoisting mechanism when it is determined that the user is not safely inside the carriage frame. According to one non-limiting embodiment, the operation of the swing arm is such that when the swing arm is open, the motor(s) of the OTSV are prevented from operating. This provides safety by ensuring that the operator cannot fall out of the carriage during movement of the carriage. Non-limiting ways of performing this function include an electrical switch which is moved from an open to a closed position when the swing arm is closed or vice versa. The switch can be mounted to either the swing arm or a portion of the carriage and is connected to a control which prevents operation of the motor(s) when the control determines that the switch indicates that the swing arm is opened.

With reference to FIGS. 5 and 6, there is shown enlarged views of the trolley assembly used on the overhead transport service vehicle system 10. The trolley assembly includes a trolley support 19 which preferably has a low profile in order to allow the user to more easily assess or reach the track. Motors 18 are mounted to the trolley support 19. Each motor 18 has one end coupled to a pulley 24. As a result, rotation of the pulleys in one direction by the motors causes a winding up of the tension members 17 and a corresponding lifting of the carriage frame. Of course, rotation of the pulleys in another direction causes an unwinding of the tension members 17 and a corresponding lowering of the carriage frame. Two axle supports 21 are secured to the upper side of the trolley support 19. An axle assembly having two wheels 20 is secured to each axle support 21. The wheel spacing, and, in particular, the configuration of the trolley assembly is preferably sized and configured to properly move within track or rail systems used in semiconductor manufacturing facilities.

FIGS. 7 and 8 show how the overhead transport service vehicle of FIG. 1 can be installed on an overhead track 100. In FIG. 7, the user positions him or her self within the carriage frame of the vehicle 10. Then, the user can activate a remote control device to activate the lifting motors of the trolley assembly. Once the carriage frame is lifted up to the track 100, the user can activate the remote control to cause the vehicle 10 to move along (see arrow in FIG. 8) the track 100. Once the user reaches the desired position, the user can service the track 100 using the tools and replacement parts stored in the containers of the carriage frame. When the servicing of the track 100 is complete, the user can activate the remote control to move the vehicle 10 to a safe lowering position and then activate the motors 18 to cause a lowering of the carriage frame to a floor of the facility.

Figure 9:
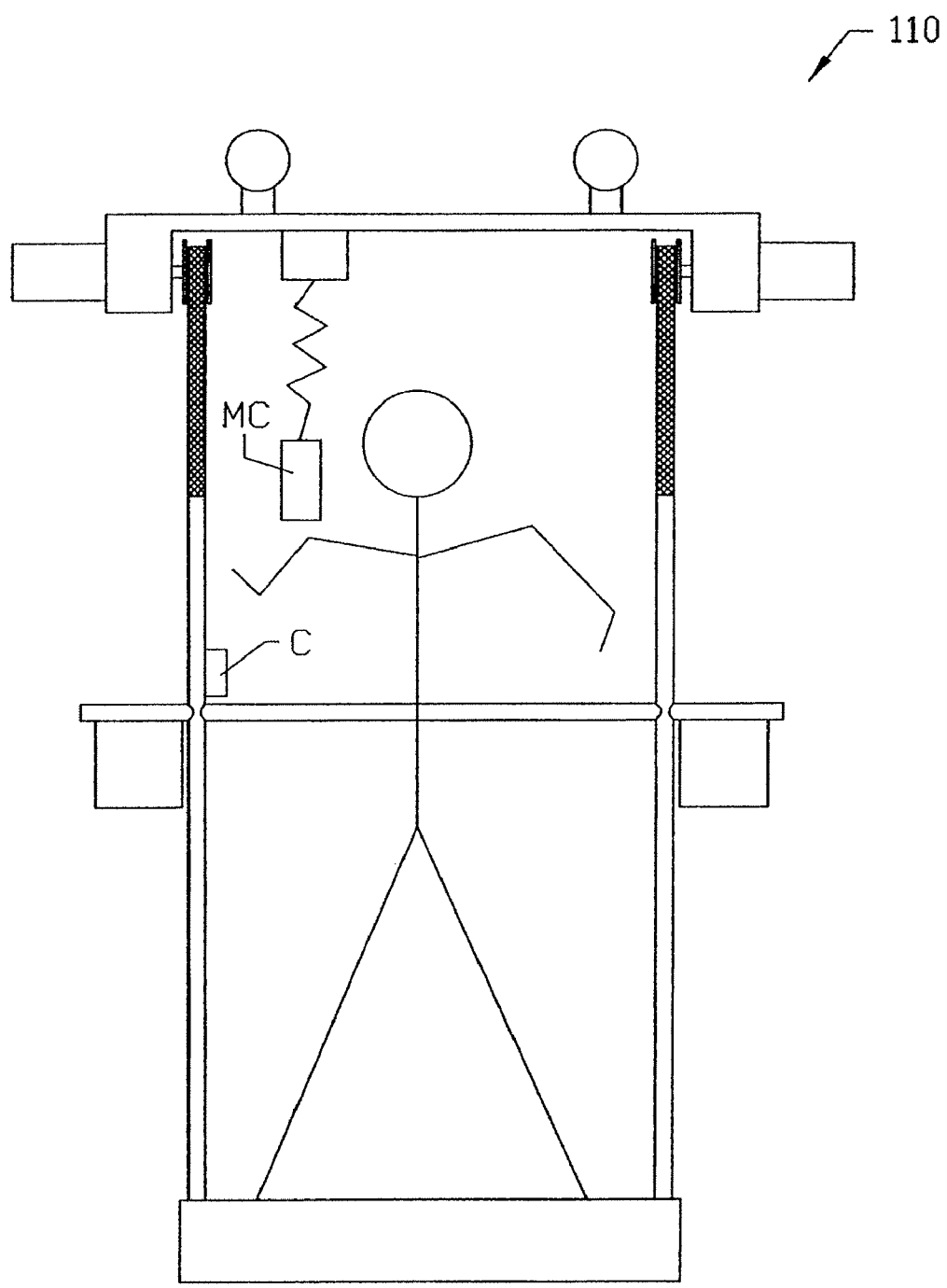
FIG. 9 shows a front view of an embodiment of the overhead transport service vehicle in accordance with the invention.

FIG. 9 shows a front view of another embodiment of the overhead transport service vehicle 110. The vehicle 110 is similar to that shown in FIG. 1 except that it also includes a control C which is mounted to the carriage frame and a main control MC coupled to the trolley assembly. The control C includes buttons for operating the lifting motors of the trolley assembly. Once the carriage frame is lifted to the proper or desired height, the user can control the movement of the vehicle 110 along the track using the main control MC.

Figure 11:
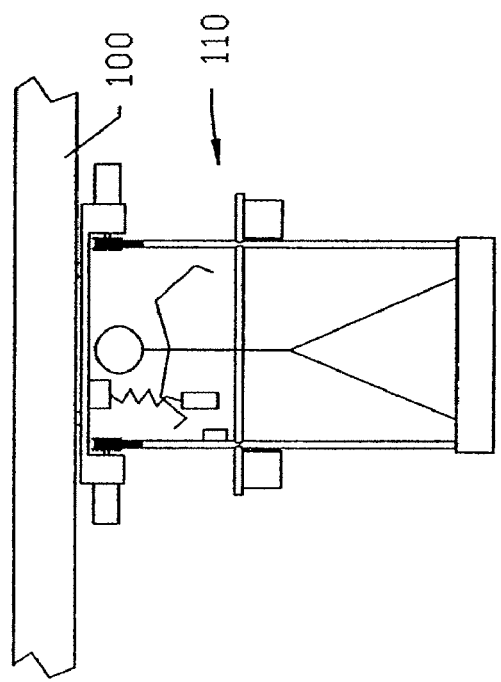
FIG. 11 shows another front view of FIG. 10 after the overhead transport service vehicle is moved to a fully lifted position in accordance with the invention.
Figure 10:
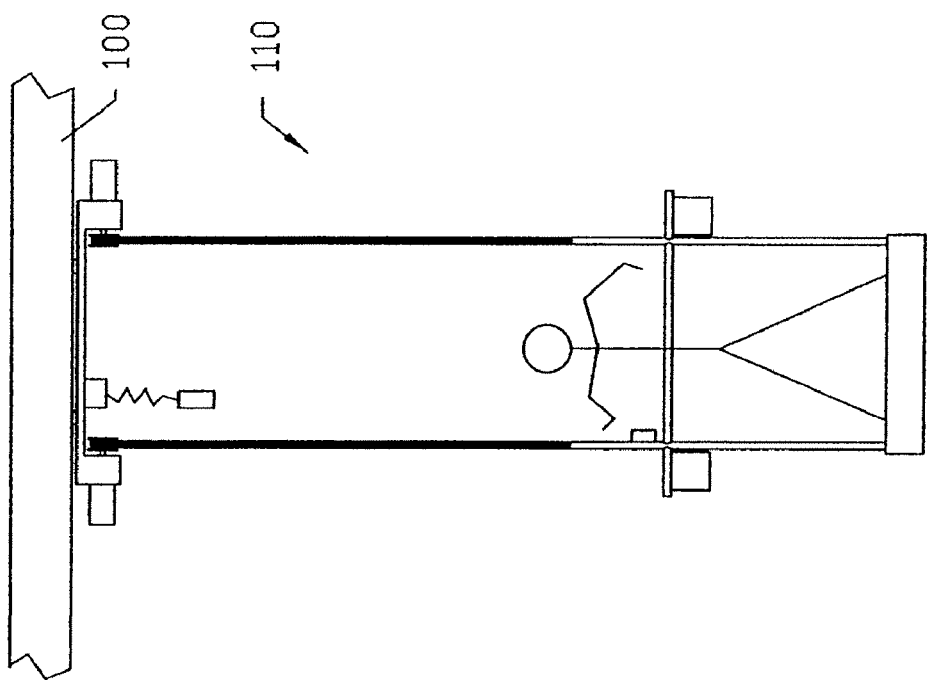
FIG. 10 shows a front view of the overhead transport service vehicle of FIG. 9 installed on an overhead track and with a user positioned within a carriage of the vehicle in accordance with the invention.

FIGS. 10 and 11 show the overhead transport service vehicle of FIG. 9 installed on an overhead track 100 and with a user positioned within a carriage of the vehicle 110. FIG. 11 shows the overhead transport service vehicle 110 after it is moved to a fully lifted position.

In FIG. 10, the user positions him or her self within the carriage frame of the vehicle 110. Then, the user can activate a control mounted to the carriage frame to activate the lifting motors of the trolley assembly. Once the carriage frame is lifted up to the track 100, the user can activate the main control to cause the vehicle 110 to move along the track 100. Once the user reaches the desired position, the user can service the track 100 using the tools and replacement parts stored in the containers of the carriage frame. When the servicing of the track 100 is complete, the user can activate the main control to move the vehicle 110 to a safe lowering position on the track 100 and then activate the motors to cause a lowering of the carriage frame to a floor of the facility using the control mounted to the carriage frame.

Figure 12:
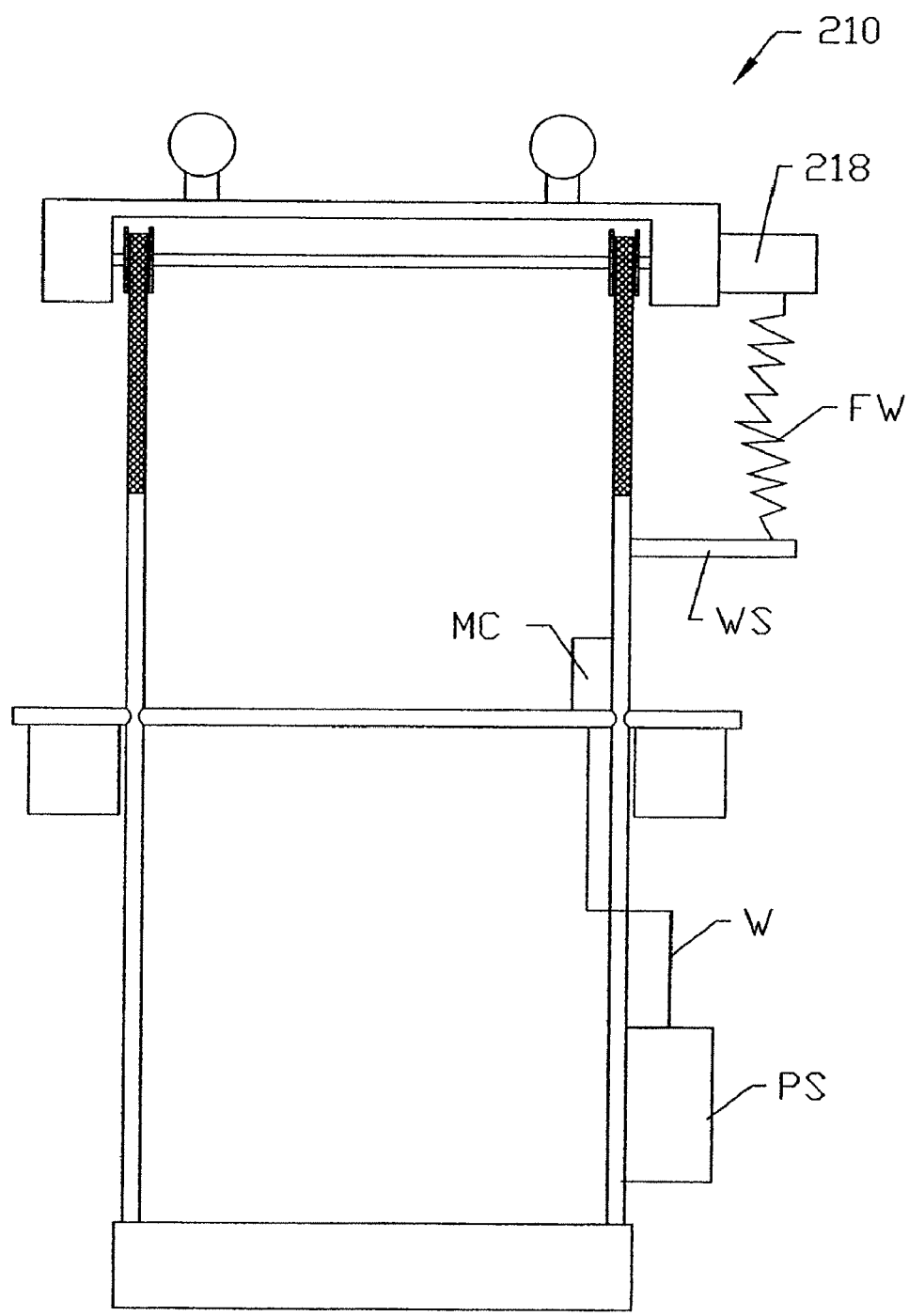
FIG. 12 shows a front view of another embodiment of the overhead transport service vehicle in accordance with the invention.

FIG. 12 shows a front view of another embodiment of the overhead transport service vehicle 210. The vehicle 210 is similar to that shown in FIG. 1 except that it utilizes a single lifting motor 218 and additionally includes a master control MC which is mounted to the carriage frame and a power supply PS (e.g., a rechargeable battery or fuel cell) coupled to the carriage frame. An electrical wire(s) conduit W conveys power from the power supply PS to the motor 218 via the master control MS. The master control MC includes buttons for operating the lifting motor 218 of the trolley assembly. A flexible expandable wire coil FW electrically connects the master control MS to the motor 218 and a motor (not shown) which moves the vehicle 210 along the track. A support WS is secured to the carriage frame ensures that the wire FW does not form an obstruction for the user. The user can control both the lifting motor 218 and the movement of the vehicle 210 along the track using the main control MC.

The power supply PS and/or master control MS can also preferably be utilized on any of the other embodiments discussed herein. Alternatively, the embodiment shown in FIG. 12, as well as each of the other embodiments disclosed herein, can draw power for the motors of the trolley assembly directly from the track via, e.g., induction, or via contacts arranged on the trolley assembly which slidably engage with contact strips arranged on the track.

Figure 13:
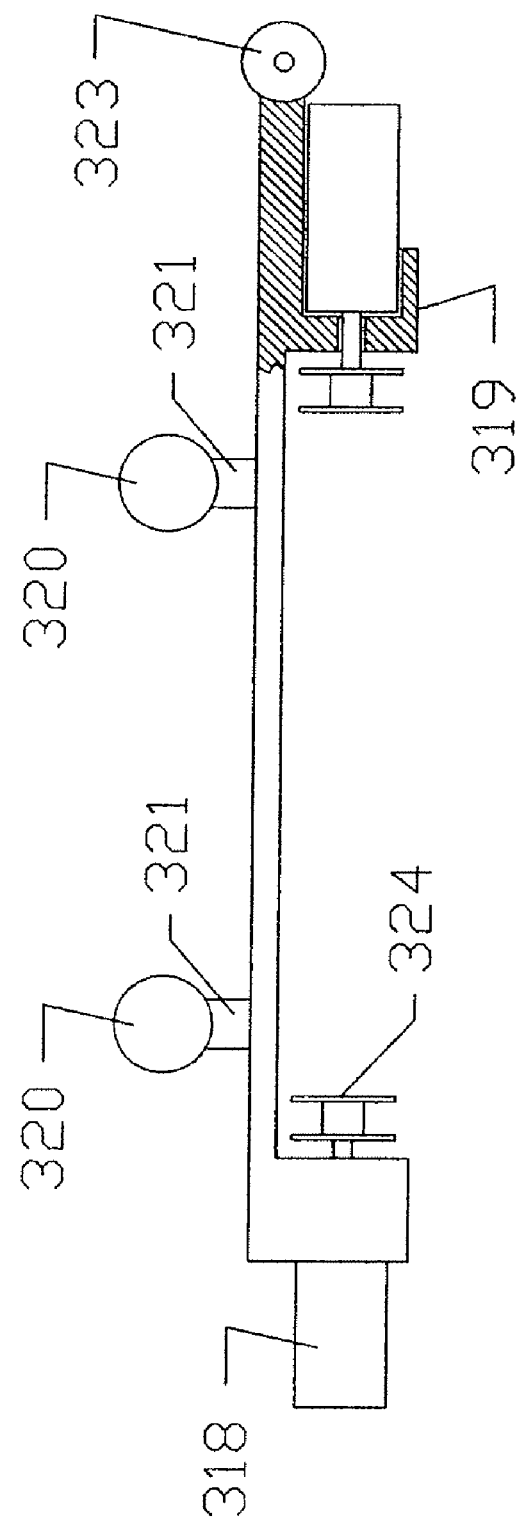
FIG. 13 shows a front view of an optional trolley assembly which can be used on any of the overhead transport service vehicle embodiments in accordance with the invention.

FIG. 13 shows one non-limiting manner in which trolley assembly can be provided with an additional motor 323 for moving the overhead transport service vehicle along the track according to the invention. As is the case in the previous embodiments, the trolley assembly utilizes a trolley support 319. Motors 318 are mounted to the trolley support 319. Each motor 318 has one end coupled to a pulley 324. As a result, rotation of the pulleys in one direction by the motors causes a winding up of the tension members and a corresponding lifting of the carriage frame. Of course, rotation of the pulleys in another direction causes an unwinding of the tension members and a corresponding lowering of the carriage frame. Axle supports 321 are secured to the upper side of the trolley support 319. An axle assembly having two wheels 320 is secured to each axle support 321. The wheel spacing, and, in particular, the configuration of the trolley assembly is preferably sized and configured to properly move within track or rail systems used in semiconductor manufacturing facilities. The trolley assembly shown in FIG. 13 can be used on any of the herein disclosed embodiments.

The invention also provides for a method of allowing a user to access an overhead track, wherein the method includes supporting the user in a carriage frame structured and arranged to carry a user, lifting the carriage frame and the user with a hoisting mechanism comprising at least one device for lifting and lowering the carriage frame, and transporting the carriage frame and the user with at least one moving device for causing movement of the hoisting mechanism along the track. The user can preferably control the at least one lifting device and the at least one moving device. The track can preferably be a track of a semiconductor manufacturing facility.

The method and apparatus as described above can be used in a facility which is used for the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modifications and in the spirit and scope of the appended claims.

What is claimed:

1. An overhead transport service vehicle system adapted to allow a user to access and service an overhead track system, comprising:

a carriage frame structured and arranged to carry the user;

a hoisting mechanism comprising at least one lifting device for lifting and lowering the carriage frame;

at least one moving device for causing movement of the hoisting mechanism along one of a track or rail of the overhead track system;

a swing arm having one end pivotally mounted to a portion of the carriage frame and another end which is locked to another portion of the carriage frame, wherein the locking of the swing arm is by a sliding sleeve structured to slide over an area where the swing arm meets the another portion of the carriage frame; and a control controlling at least one of the at least one lifting device and the at least one moving device.

2. The system of claim 1, further comprising a trolley assembly comprising:
the hoisting mechanism; and
a mechanism movably connecting the trolley assembly to the overhead track system and comprising wheels structured and arranged to move inside the overhead track system; and
the at least one moving device causes movement of the trolley assembly along the overhead track system of a semiconductor manufacturing facility while the wheels remain within the overhead track system.

3. The system of claim 1, wherein the overhead transport service vehicle system is configured to move on the overhead track system of a semiconductor manufacturing facility.

4. The system of claim 1, wherein the at least one lifting device comprises at least one tension belt coupled to a pulley.

5. The system of claim 1, wherein the carriage frame comprises one of a tubular construction and aluminum tubular members.

6. The system of claim 1, wherein the carriage frame comprises at least one container for storing at least one of tools and replacement components.

7. The system of claim 1, wherein the carriage frame is sized for a single user.

8. The system of claim 1, wherein the carriage frame comprises a generally rectangular floor.

9. The system of claim 1, wherein the at least one moving device comprises a trolley assembly.

10. The system of claim 1, wherein the control is accessible to the user inside the carriage frame.

11. The system of claim 1, further comprising a system for preventing activation of the hoisting mechanism when it is determined that the user is not safely inside the carriage frame.

12. The system of claim 1, further comprising a trolley assembly comprising the hoisting mechanism and wheels structured and arranged to move inside the overhead track system.

13. The system of claim 12, further comprising at least one moving device for causing movement of the trolley assembly along the overhead track system of the semiconductor manufacturing facility while all of the wheels of the trolley assembly remain within the overhead track system.

14. The system of claim 13, wherein the carriage frame comprises:
four vertical tubular members whose bottom ends are connected to a toe kick plate member and which include upper ends which are angled towards each other;
horizontal members arranged to connect each oppositely arranged pair of the four vertical tubular members; and
two oppositely arranged support members which are each sized and configured to support a container.

15. An overhead transport service vehicle system, comprising:
a carriage frame structured and arranged to carry a user, wherein the carriage frame comprises:
four vertical tubular members whose bottom ends are connected to a toe kick plate member and which include upper ends which are angled towards each other;
horizontal members arranged to connect each oppositely arranged pair of the four vertical tubular members; and
support members which are each sized and configured to support a container;
a hoisting mechanism comprising at least one device for lifting and lowering the carriage frame and at least one trolley assembly for moving the hoisting mechanism along one of a track or rail, wherein the trolley assembly comprises wheels structured and arranged to move inside an overhead track system;
at least one moving device for causing movement of the trolley assembly along the overhead track system of the semiconductor manufacturing facility while all of the wheels of the trolley assembly remain within the overhead track system; and
a control controlling the at least one lifting device and the at least one trolley assembly, the control being accessible to the user inside the carriage frame.

16. The system of claim 15, wherein the overhead transport service vehicle system is configured move on the overhead track system of a semiconductor manufacturing facility.

17. The system of claim 15, wherein at least one of:
the at least one device comprises a motor; and
the at least one device comprises at least one tension belt coupled to a pulley.

18. The system of claim 15, wherein the carriage frame comprises a tubular construction made of aluminum tubular members.

19. The system of claim 15, wherein the carriage frame is sized for a single user.

20. The system of claim 15, wherein the carriage frame comprises a generally rectangular floor.

21. A method of allowing a user to access an overhead track, the method comprising:
supporting the user in a carriage frame structured and arranged to carry a user;
lifting the carriage frame and the user with a hoisting mechanism to a height which permits a user access to the overhead track of a semiconductor manufacturing facility for servicing thereto;
transporting the carriage frame by moving the hoisting mechanism along the overhead track;
movably connecting an overhead transport service vehicle to the overhead track of a semiconductor manufacturing facility; and
transporting the carriage frame by moving the trolley assembly along the overhead track of the semiconductor manufacturing facility while all of wheels of the trolley assembly remain within the overhead track.

22. The method of claim 21, further comprising controlling the lifting and the transporting by controlling at least one device and at least one moving device.

23. The method of claim 21, further comprising:
movably connecting an overhead transport service vehicle to the overhead track of a semiconductor manufacturing facility, wherein the overhead transport service vehicle comprises a carriage frame and a trolley assembly that includes the hoisting mechanism and wheels structured and arranged to move within the overhead track; and
transporting the carriage frame by moving the trolley assembly along the overhead track of the semiconductor manufacturing facility while the wheels remain within the overhead track.

* * * * *